(12) United States Patent
Yamamoto et al.

(10) Patent No.: US 9,978,839 B2
(45) Date of Patent: May 22, 2018

(54) METHOD OF MANUFACTURING A MOSFET ON AN SOI SUBSTRATE

(71) Applicant: Renesas Electronics Corporation, Tokyo (JP)

(72) Inventors: Yoshiki Yamamoto, Tokyo (JP); Hideki Makiyama, Tokyo (JP); Toshiaki Iwamatsu, Tokyo (JP); Takaaki Tsunomura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/628,925

(22) Filed: Jun. 21, 2017

(65) Prior Publication Data

US 2017/0294513 A1    Oct. 12, 2017

Related U.S. Application Data

(63) Continuation of application No. 15/279,565, filed on Sep. 29, 2016, now Pat. No. 9,773,872, which is a (Continued)

(30) Foreign Application Priority Data

Jan. 23, 2012  (JP) ................. 2012-011213
Jul. 24, 2012  (JP) ................. 2012-011213

(51) Int. Cl.
H01L 21/00        (2006.01)
H01L 29/10        (2006.01)
(Continued)

(52) U.S. Cl.
CPC ........ H01L 29/1083 (2013.01); H01L 21/265 (2013.01); H01L 21/74 (2013.01);
(Continued)

(58) Field of Classification Search
CPC ..... H01L 21/823814; H01L 21/823807; H01L 21/84; H01L 29/66477; H01L 21/265
See application file for complete search history.

(56) References Cited

U.S. PATENT DOCUMENTS 6,323,525 B1    11/2001  Noguchi et al.
6,677,212 B1     1/2004  Yoshioka et al.
(Continued)

FOREIGN PATENT DOCUMENTS

JP    08-032040 A    2/1996
JP    08-153880 A    6/1996
(Continued)

OTHER PUBLICATIONS

Office Action dated Apr. 5, 2016, in Japanese Patent Application No. 2012-163907.
(Continued)

*Primary Examiner* — Ngan Ngo
(74) *Attorney, Agent, or Firm* — Shapiro, Gabor and Rosenberger, PLLC

(57) ABSTRACT

Occurrence of short-channel characteristics and parasitic capacitance of a MOSFET on a SOI substrate is prevented. A sidewall having a stacked structure obtained by sequentially stacking a silicon oxide film and a nitride film is formed on a side wall of a gate electrode on the SOI substrate. Subsequently, after an epitaxial layer is formed beside the gate electrode, and then, the nitride film is removed. Then, an impurity is implanted into an upper surface of the semiconductor substrate with using the gate electrode and the epitaxial layer as a mask, so that a halo region is formed in only a region of the upper surface of the semiconductor substrate which is right below a vicinity of both ends of the gate electrode.

7 Claims, 11 Drawing Sheets

Related U.S. Application Data continuation of application No. 14/929,646, filed on Nov. 2, 2015, now Pat. No. 9,484,433, which is a continuation of application No. 14/579,242, filed on Dec. 22, 2014, now Pat. No. 9,196,705, which is a continuation of application No. 13/747,537, filed on Jan. 23, 2013, now Pat. No. 8,941,178.

(51) Int. Cl.
| | | |
|---|---|---|
| H01L 29/78 | (2006.01) | |
| H01L 29/06 | (2006.01) | |
| H01L 21/74 | (2006.01) | |
| H01L 29/66 | (2006.01) | |
| H01L 21/265 | (2006.01) | |
| H01L 21/8238 | (2006.01) | |
| H01L 21/84 | (2006.01) | |

(52) U.S. Cl.
CPC ........ *H01L 21/823807* (2013.01); *H01L 21/823814* (2013.01); *H01L 21/84* (2013.01); *H01L 29/0649* (2013.01); *H01L 29/665* (2013.01); *H01L 29/6659* (2013.01); *H01L 29/66477* (2013.01); *H01L 29/66537* (2013.01); *H01L 29/7833* (2013.01)

(56) References Cited

U.S. PATENT DOCUMENTS

| | | | |
|---|---|---|---|
| 7,061,060 | B2 | 6/2006 | Yashuara et al. |
| 9,196,705 | B2 * | 11/2015 | Yamamoto ........ H01L 29/78651 |
| 2007/0128820 | A1 | 6/2007 | Majumdar et al. |
| 2010/0001323 | A1 | 1/2010 | Tateshita |
| 2010/0148260 | A1 | 6/2010 | Kim et al. |
| 2010/0237417 | A1 | 9/2010 | Wang et al. |
| 2010/0258869 | A1 | 10/2010 | Morita et al. |
| 2010/0314694 | A1 | 12/2010 | Mayuzumi et al. |
| 2011/0101457 | A1 * | 5/2011 | Yako ................... H01L 21/2652 257/347 |
| 2012/0043623 | A1 | 2/2012 | Doris et al. |
| 2012/0104514 | A1 | 5/2012 | Park et al. |
| 2012/0146148 | A1 * | 6/2012 | Iwamatsu ............... H01L 21/84 257/351 |
| 2012/0313168 | A1 | 12/2012 | Cheng et al. |
| 2012/0326233 | A1 | 12/2012 | Wang et al. |
| 2013/0043511 | A1 | 2/2013 | Tsai et al. |
| 2013/0082311 | A1 | 4/2013 | Cheng et al. |
| 2013/0146953 | A1 | 6/2013 | Cheng et al. |
| 2013/0175596 | A1 | 7/2013 | Cheng et al. |
| 2013/0175610 | A1 | 7/2013 | Flachowsky et al. |
| 2013/0181290 | A1 | 7/2013 | Hurwitz et al. |
| 2013/0234217 | A1 | 9/2013 | Lin et al. |
| 2013/0285141 | A1 | 10/2013 | Kuo et al. |
| 2013/0299907 | A1 | 11/2013 | Ota et al. |
| 2014/0145242 | A1 | 5/2014 | Huang et al. |
| 2014/0191298 | A1 | 7/2014 | Chen et al. |
| 2014/0203364 | A1 * | 7/2014 | Tsunomura ....... H01L 29/66742 257/347 |
| 2015/0102416 | A1 | 4/2015 | Yin et al. |
| 2015/0235908 | A1 | 8/2015 | Cheng et al. |

FOREIGN PATENT DOCUMENTS

| | | |
|---|---|---|
| JP | 2001-015591 A | 1/2001 |
| JP | 2007-188992 A | 7/2007 |
| JP | 2009-158677 A | 7/2009 |
| JP | 2010-251344 A | 11/2010 |

OTHER PUBLICATIONS

Office Action dated Apr. 10, 2018, in Japanese Patent Application No. 2017-124946.

* cited by examiner

METHOD OF MANUFACTURING A MOSFET ON AN SOI SUBSTRATE

CROSS-REFERENCE TO RELATED APPLICATION

The present application claims priority from Japanese Patent Application No. 2012-011213 filed on Jan. 23, 2012, and Japanese Patent Application No. 2012-163907 filed on Jul. 24, 2012, the content of which is hereby incorporate-' by reference into this application.

TECHNICAL FIELD OF THE INVENTION

The present invention relates to a semiconductor device and a method of manufacturing the same. More particularly, the present invention relates to a technique effectively applied to a semiconductor device using a SOI (Silicon On Insulator) substrate and to a method of manufacturing the same.

BACKGROUND OF THE INVENTION

As a semiconductor device capable of suppressing generation of parasitic capacitance, a semiconductor device using a SOI substrate is currently used. The SOI substrate is a substrate obtained by forming a BOX (Buried Oxide) film (embedded oxide film) on a supporting substrate made of high-resistance Si (silicon) or others and forming a thin layer (silicon layer) mainly containing Si (silicon) on the BOX film. When a MOSFET (Metal Oxide Semiconductor Field Effect Transistor: MOS field-effect transistor) is formed on the SOI substrate, the parasitic capacitance generated in a diffusion region formed in the silicon layer can be reduced. Therefore, by manufacturing a semiconductor device by using the SOI substrate, improvement in an integration density and an operating speed of the semiconductor device, achievement of latch-up free, etc. can be expected.

Patent Document 1 (Japanese Patent Application Laid-Open Publication No. 2009-158677) describes a technique that a nitride film for a dummy sidewall is formed on a side wall of a gate electrode on a SOI substrate via an oxide film for a sidewall, and then, a selective epitaxial growth region is formed on a SOI layer of an upper surface of the SOI substrate, followed by removal of the nitride film for the dummy sidewall, and then, implantation of an impurity for extension and an impurity for halo into the supporting substrate. Here, the document does not specifically describe at which position in the supporting substrate a Halo portion (halo region) formed in the supporting substrate is formed, and does not describe how different a concentration of the impurity configuring the Halo portion is between a portion right below the gate electrode and other regions, either.

Patent Document 2 (Japanese Patent Application Laid-Open Publication No. 2007-188992) describes a technique that, when a MOSFET is formed on the SOI substrate, a high-concentration diffusion region is formed in a vicinity of a surface of the supporting substrate right below the gate electrode, the high-concentration diffusion region being formed in regions which are below a drain region and below a source region and at a predetermined depth from the surface of the supporting substrate.

Patent Document 3 (Japanese Patent Application Laid-Open Publication No. 2010-251344) describes a technique that a p-well is formed in the entire upper surface of a silicon substrate below the SOI substrate, and an n-channel-type MIS transistor is formed on the SOI layer thereon.

SUMMARY OF THE INVENTION

When a MOSFET is provided on a SOI substrate, there is an advantage that miniaturization of the MOSFET is facilitated. However, if the MOSFET is miniaturized, short-channel characteristics (short-channel effect) are deteriorated, and there is a problem that the performance of the semiconductor device is lowered.

Also, in order to suppress the short-channel characteristics, it is conceivable to form a halo region, which is a high-concentration diffusion region, in a supporting substrate. However, when the halo region is formed in the upper surface of the supporting substrate which is right below the gate electrode, there is a problem that the effect of suppressing the short-channel characteristics cannot be obtained well.

Further, when the halo region is formed in the entire upper surface of the supporting substrate, the halo region exists right below the high-concentration diffusion region which configures the source/drain regions, and therefore, there is a problem that diffusion capacitance is generated between the source/drain regions and the halo region via the BOX film.

Other preferred aims and novel characteristics will be apparent from the description of the present specification and the accompanying drawings.

The typical ones of embodiments disclosed in the present application will be briefly described as follows.

In a method of manufacturing a semiconductor device according to one embodiment, a sidewall is formed on a side wall of a gate electrode on a SOI substrate, and then, an epitaxial layer is formed on a silicon layer on an upper surface of the SOI substrate, followed by removal of the sidewall, and then, implantation of an impurity with using the gate electrode and the epitaxial layer as a mask, so that a halo region is formed in an upper surface of a supporting substrate.

According to one embodiment disclosed in the present application, performance of a semiconductor device can be improved. More particularly, short-channel characteristics of the semiconductor device can be suppressed.

Also, generation of diffusion capacitance can be suppressed.

BRIEF DESCRIPTIONS OF THE DRAWINGS

DESCRIPTIONS OF THE PREFERRED EMBODIMENTS

Hereinafter, embodiments will be described in detail with reference to the drawings. Note that members having the same function are denoted by the same reference symbols throughout all drawings for describing the embodiments, and the repetitive description thereof will be omitted. Also, in the following embodiments, the description of the same or similar parts will not be repeated unless particularly required.

First Embodiment

Manufacturing steps of a MOS-type field-effect transistor (hereinafter, simply referred to as "MOSFET") according to the present embodiment will be explained with reference to drawings. FIGS. 1 to 7 are cross-sectional views during the manufacturing steps of a semiconductor device according to the present embodiment such as a semiconductor device having an n-channel-type MOSFET on a SOI substrate.

Figure 1:
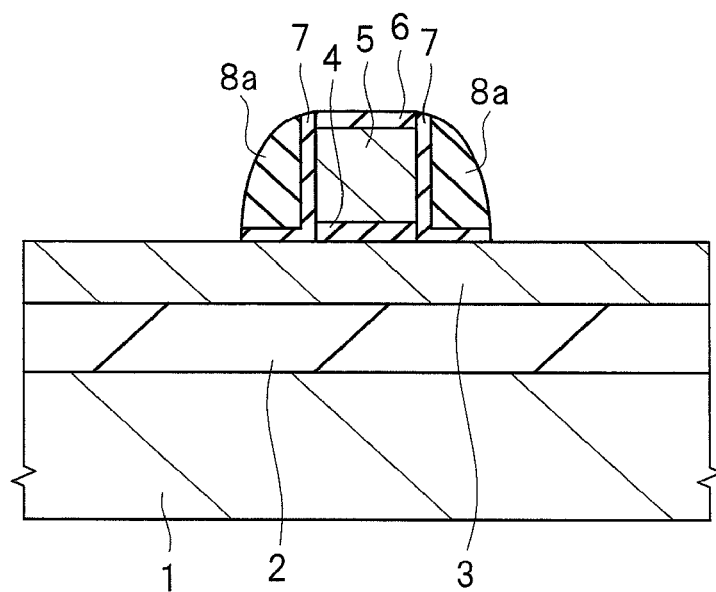
FIG. 1 is a cross-sectional view illustrating a method of manufacturing a semiconductor device according to a first embodiment of the present invention.

First, as illustrated in FIG. 1, a semiconductor substrate 1 including a BOX film 2 and a silicon layer (SOI layer) 3 stacked in an upper portion thereof is prepared. The semiconductor substrate 1 is a supporting substrate made of Si (silicon), the BOX film 2 on the semiconductor substrate 1 is a silicon oxide film, and the silicon layer 3 on the BOX film 2 is a layer made of monocrystalline silicon having a resistance of about 1 to 10 Ωcm.

The SOI substrate formed of the BOX film 2 and the silicon layer 3 can be formed by a SIMOX (Silicon Implanted Oxide) method in which $O_2$ (oxygen) is ion-planted at high energy into a principal surface of the semiconductor substrate 1 made of Si (silicon) and the Si (silicon) is bound with the oxygen in a subsequent thermal treatment to form a buried oxide film (BOX film) at a position slightly deeper than the surface of the semiconductor substrate. Alternatively, the SOI substrate can be formed by adhering the semiconductor substrate 1 including an oxide film formed on a surface thereof to another semiconductor substrate made of Si (silicon) by applying high heat and a pressure thereto, and then, thinning a silicon layer on one side thereof by polishing.

Figure 2:
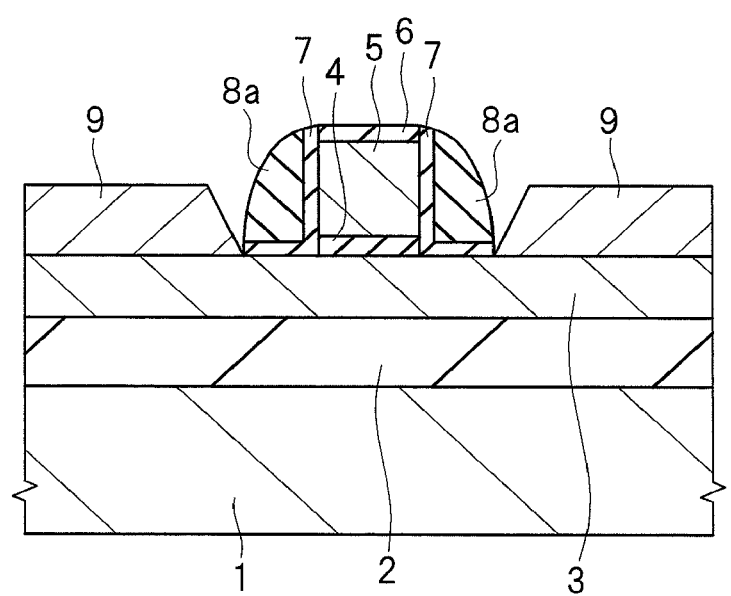
FIG. 2 is a cross-sectional view illustrating the method of manufacturing the semiconductor device continued from FIG. 1.

Next, as illustrated in FIG. 2, a p-type impurity (for example, B (boron)) is implanted into the silicon layer 3 at a relatively low concentration by an ion implantation method, and then, a silicon oxide film (an insulating film for a gate insulating film 4) is formed on the silicon layer 3 by using a thermal oxidation method, a CVD (Chemical Vapor Deposition) method, or others. Then, a polysilicon film (a conductor film for a gate electrode 5) and a silicon nitride ($Si_3N_4$) film 6 are sequentially formed on the silicon oxide film by using the CVD method or others, and the silicon nitride film 6 is patterned by using a photolithography technique and a dry etching method. Subsequently, the polysilicon film and the silicon oxide film are patterned by the dry etching method with using the silicon nitride film 6 as a hard mask. In this manner, the gate insulating film 4 formed of the silicon oxide film is formed on the silicon layer 3, and the gate electrode 5 formed of the polysilicon film is formed on the gate insulating film 4.

Note that the polysilicon film configuring the gate electrode 5 is set to be a low-resistance n-type semiconductor film (doped polysilicon film) obtained by ion-implanting an n-type impurity such as P (phosphorous) or As (arsenic) thereto. Also, the polysilicon film which is an amorphous silicon film upon film formation can be changed into a polycrystalline silicon film by thermal treatment after the film formation (after the ion implantation).

Subsequently, a silicon oxide film 7 and a silicon nitride ($Si_3N_4$) film 8a are formed by using, for example, the CVD method so as to cover the upper surface of the silicon layer 3 and the gate electrode 5, and then, the silicon oxide film 7 and the silicon nitride film 8a are partially removed by performing anisotropic etching by a RIE (Reactive Ion Etching) method or others to expose the upper surface of the silicon layer 3. In this manner, a stacked film formed of the silicon oxide film 7 and the silicon nitride film 8a is formed on the side wall of the gate electrode 5 in self alignment.

Here, the silicon oxide film 7 is an insulating film for forming a side wall, and the silicon nitride film 8a is an insulating film for forming a dummy side wall for forming an epitaxial layer (elevated layer, selective growth layer) at a position away from the gate electrode in a later step. That is, the stacked film formed of the silicon oxide film 7 and the silicon nitride film 8a is the dummy side wall, and the silicon oxide film 7 remains but the silicon nitride film 8a does not remain in a completed semiconductor device.

Then, as illustrated in FIG. 2, an epitaxial layer 9 mainly made of Si (silicon) is formed on the upper surface of the silicon layer 3, which is exposed from the gate electrode 5, the silicon oxide film 7, and the silicon nitride film 8a, by using the epitaxial growth method. In this manner, a silicon layer whose upper surface is higher than the silicon layer 3 is formed in a region outside the gate electrode 5, the silicon oxide film 7, and the silicon nitride film 8a.

At this time, the upper surface of the epitaxial layer 9 is not along the side wall of the gate electrode 5 but along the upper surface of the silicon layer 3, and is at a position higher than an upper surface of the formed silicon oxide film 7 in a film thickness. That is, while the film thickness of the silicon oxide film 7 is about 5 nm, the epitaxial layer 9 has a film thickness of 20 to 50 nm which is thicker than a film thickness of the silicon oxide film 7.

Note that the formation of the epitaxial layer 9 beside the gate electrode 5 results from an extremely-thin film thickness of the silicon layer 3. And, the is because, when a silicide layer is formed on surfaces of the source/drain regions configuring a MOSFET in a later step, if the source/drain regions are formed in the silicon layer 3 without forming the epitaxial layer 9, the silicon for forming the silicide layer is not sufficient only from the film thickness of the silicon layer 3. That is, one of reasons for forming the epitaxial layer 9 is that it is required to compensate for the film thickness of the silicon layer which configures the source/drain regions when the silicide layer and the source/drain regions are formed. Further, another reason for forming the epitaxial layer 9 is cited as prevention of increase in the parasitic resistance accompanied by the source/drain regions of the MOSFET.

Figure 3:
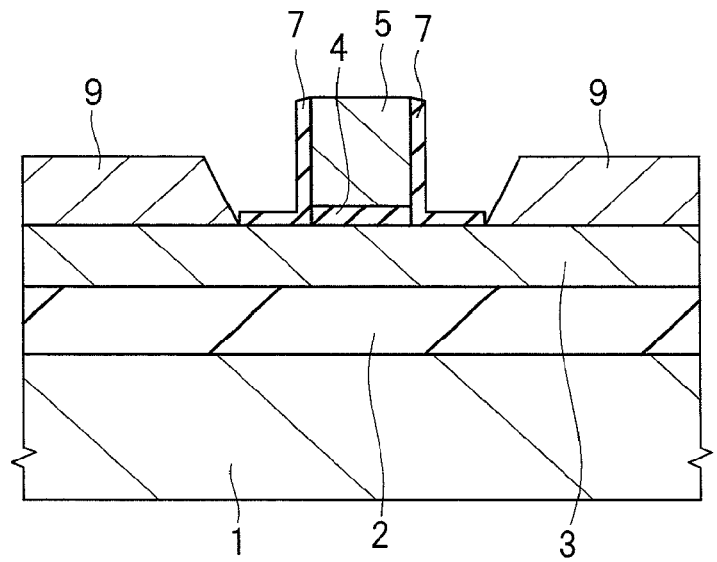
FIG. 3 is a cross-sectional view illustrating the method of manufacturing the semiconductor device continued from FIG. 2.

Next, as illustrated in FIG. 3, the silicon nitride film 6 above the gate electrode 5 and the silicon nitride film 8a which is the insulating film for forming the dummy side wall are removed by using a wet etching method.

Figure 4:
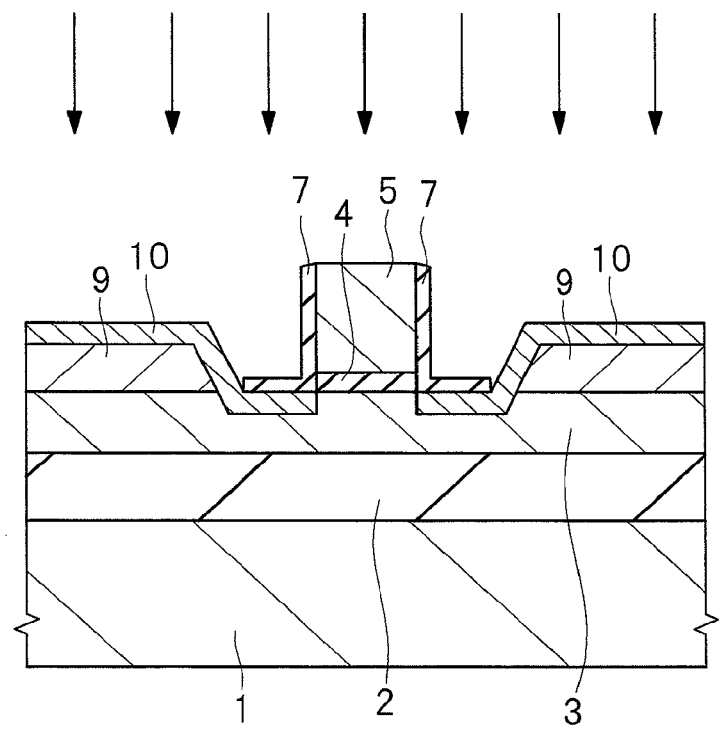
FIG. 4 is a cross-sectional view illustrating the method of manufacturing the semiconductor device continued from FIG. 3.

Then, as illustrated in FIG. 4, an n-type impurity (for example, As (arsenic)) is implanted into the upper surface of the silicon layer 3 at a relatively low concentration by using the ion implantation method with using the gate electrode 5 as a mask, so that an extension region 10 is formed in an upper surface of the epitaxial layer 9 and an upper surface of the silicon layer 3 which are exposed from sides of the gate electrode 5 and the gate insulating film 4. The extension region 10 is not formed in at least a part of the upper surface of the silicon layer 3 right below the gate electrode 5. Also, the impurity ions implanted in this ion implantation step transmit through the silicon oxide film 7 having a film thickness of about 5 nm, and therefore, the extension region 10 is formed also in the silicon layer 3 right below the silicon oxide film 7.

Note that the extension region 10 is illustrated in the vicinity of the upper surface of the silicon layer 3 in FIG. 4. However, the extension region 10 may be formed from the upper surface of the silicon layer 3 to a lower surface thereof.

Figure 5:
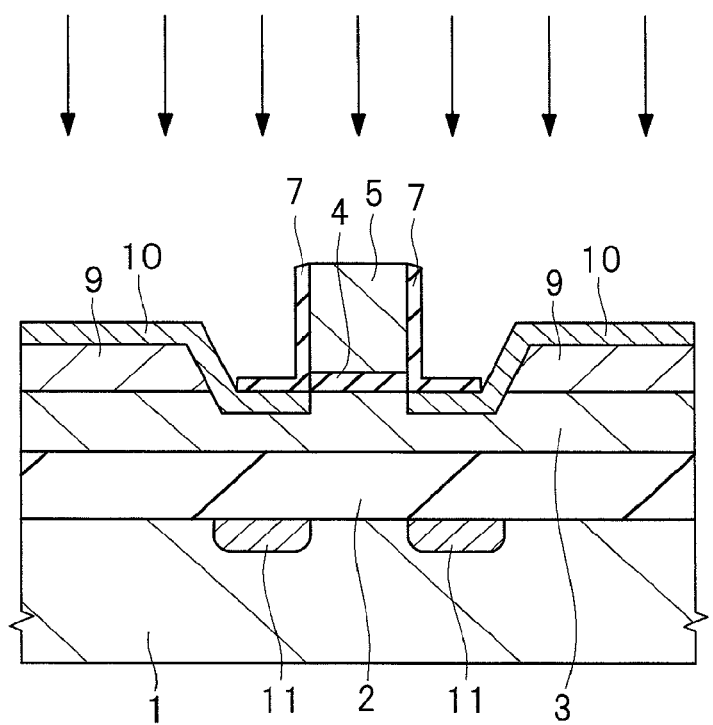
FIG. 5 is a cross-sectional view illustrating the method of manufacturing the semiconductor device continued from FIG. 4.

Next, as illustrated in FIG. 5, a p-type impurity (for example, B (boron)) is implanted into the upper surface of the semiconductor substrate 1 from above the semiconductor substrate 1 at a relatively high concentration by using the ion implantation method with using the gate electrode 5 and the epitaxial layer 9 as a mask, so that a halo region (p-type semiconductor region) 11 is formed right below a portion between the gate electrode 5 and the epitaxial layer 9 in the upper surface of the semiconductor substrate 1. The halo region 11 is a semiconductor region (diffusion layer) formed for suppressing the short-channel characteristics of the MOSFET formed in a later step.

Here, the p-type impurity (for example, B (boron)) is almost not introduced into the semiconductor substrate 1 right below the gate electrode 5 and right below the epitaxial layer 9 since the gate electrode 5 and the epitaxial layer 9 serve as a mask. Therefore, a concentration of the p-type impurity (for example, B (boron)) in the upper surface of the semiconductor substrate 1 is higher in a region outside the gate electrode 5 right below the portion between the gate electrode 5 and the epitaxial layer 9 than a portion right below the gate electrode 5. Similarly, the concentration of the p-type impurity (for example, B (boron)) in the upper surface of the semiconductor substrate 1 is higher in a region right below the portion between the gate electrode 5 and the epitaxial layer 9 than a portion right below the epitaxial layer 9.

In this manner, a reason why the halo region 11 is not formed in the portion right below the gate electrode 5 but formed only in the vicinity of the portion right below both ends of the gate electrode 5 is that a film thickness including those of the gate electrode 5, the gate insulating film 4, the silicon layer 3, and the BOX film 2 is thicker than a film thickness including those of the silicon oxide film 7, the silicon layer 3, and the BOX film 2. Similarly, a reason why the halo region 11 is not formed in the portion right below the epitaxial layer 9 but formed only in the vicinity of the portion right below the both ends of the gate electrode 5 is that the film thickness including those of the epitaxial layer 9, the silicon layer 3, and the BOX film 2 is thicker than the film thickness including those of the silicon oxide film 7, the silicon layer 3, and the BOX film 2. Note that the film thickness of the BOX film 2 is about 10 to 50 nm, and is 10 nm here. Also, the film thickness of the silicon layer 3 is about 5 to 15 nm, and is 10 nm here.

Note that, in the present embodiment, the method has been explained, in which the ion implantation step of forming the halo region 11 is performed after the ion implantation step of forming the extension region 10. However, the halo region 11 may be formed before the formation of the extension region 10. However, the extension region 10 and the halo region 11 are formed always after the formation of the epitaxial layer 9.

Figure 6:
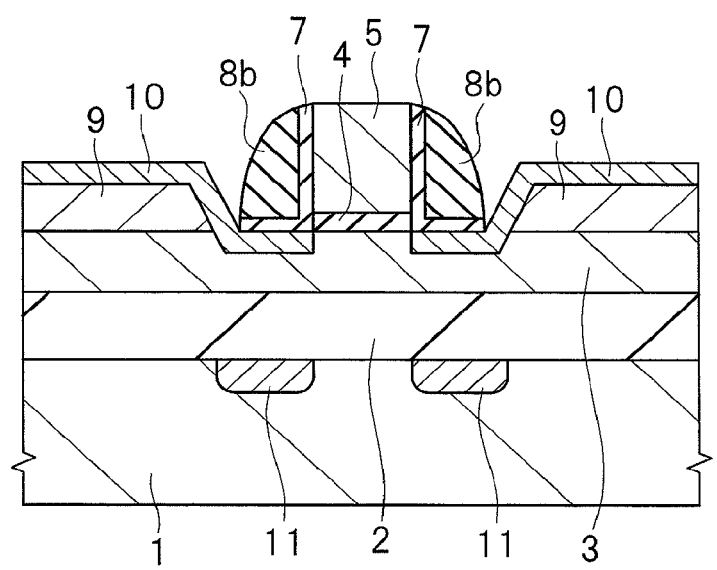
FIG. 6 is a cross-sectional view illustrating the method of manufacturing the semiconductor device continued from FIG. 5.

Next, as illustrated in FIG. 6, by using, for example, the CVD method, a silicon nitride film 8b is formed so as to cover the exposed surface of each of the gate electrode 5, the silicon oxide film 7, the silicon layer 3, and the epitaxial layer 9. Then, the silicon nitride film 8b is partially removed by performing the anisotropic etching by, for example, the RIE method to expose the upper surface of each of the gate electrode 5, the silicon layer 3, and the epitaxial layer 9. In this manner, the silicon nitride film 8b is formed on the side wall of the gate electrode 5 via the silicon oxide film 7 in the self alignment. In this manner, a side wall formed of the silicon oxide film 7 and the silicon nitride film 8b is formed on the side wall of the gate electrode 5.

Figure 7:
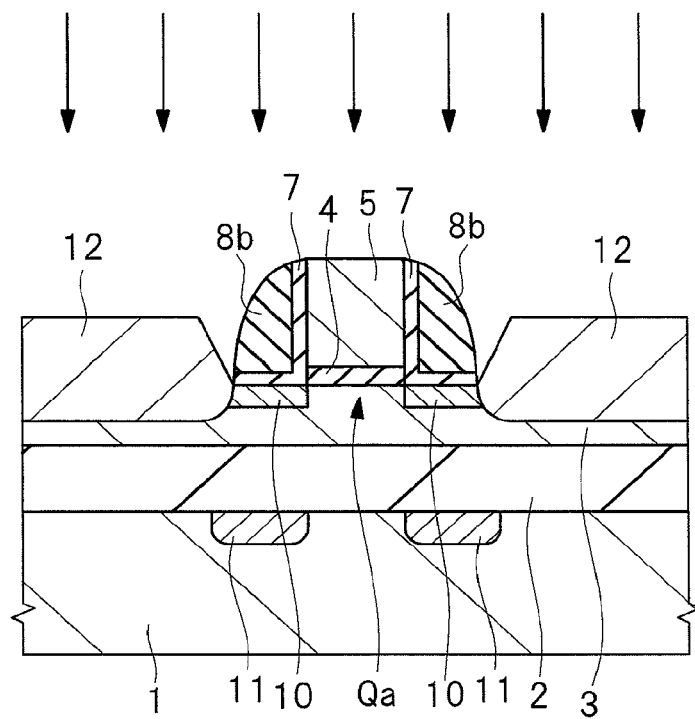
FIG. 7 is a cross-sectional view illustrating the method of manufacturing the semiconductor device continued from FIG. 6.

Next, as illustrated in FIG. 7, an n-type impurity (for example, As (arsenic)) is ion-implanted from above the semiconductor substrate 1 at a relatively high concentration with using the gate electrode 5, the silicon oxide film 7, and the silicon nitride film 8b as a mask, so that a diffusion layer 12 is formed inside the epitaxial layer 9 exposed from the gate electrode 5, the silicon oxide film 7, and the silicon nitride film 8b. The diffusion layer and the epitaxial layer 9 are semiconductor regions which configure source/drain regions. The above-described source/drain regions have a LDD (Lightly Doped Drain) structure having the extension region 10 containing the low-concentration impurity between the diffusion layer 12 to which the impurity has been introduced at the high concentration and the silicon layer 3 to be a channel region right below the gate electrode 5. Therefore, an impurity concentration of the diffusion layer 12 is higher than an impurity concentration of the extension region 10.

Through the above-described process, an n-channel-type MOSFET Qa including the gate electrode 5, the extension region 10, and the diffusion layer 12 is formed. Although detailed explanations and illustration of steps subsequent to this are omitted, the semiconductor device of the present embodiment is completed by forming a silicide layer on the gate electrode 5 and the diffusion layer 12, and then, covering the MOSFET Qa with an interlayer insulating film, connecting a contact plug which penetrates through the interlayer insulating film to the silicide layer, and forming a wiring connected to the contact plug and the upper surface of the gate electrode 5.

In the upper surface of the semiconductor substrate 1 illustrated in FIG. 7, it is assumed that a region right below the gate electrode is a first region, that a region right below the extension region 10 is a second region, and that a region right below the diffusion layer 12 is a third region. The first region, the second region, and the third region are arranged to be align in one direction in the upper surface of the semiconductor substrate 1, the first region is arranged so as to be sandwiched by the second regions, and the first region and the second regions are arranged so as to be sandwiched by the third regions. Since the halo region 11 which is an impurity diffusion layer is formed in the second region, the concentration of the impurity introduced into the halo region 11 is higher in the second region than the first region, and is higher in the second region than the third region.

Figure 18:
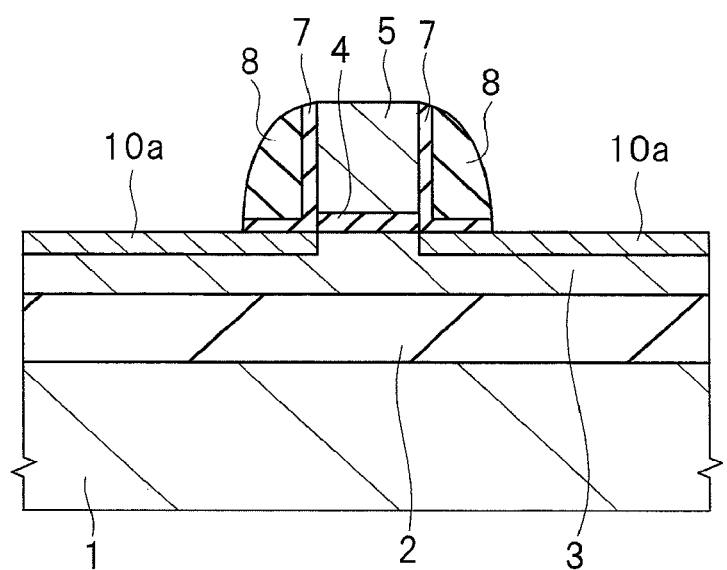
FIG. 18 is a cross-sectional view illustrating a method of manufacturing a semiconductor device as a comparative example.
Figure 19:
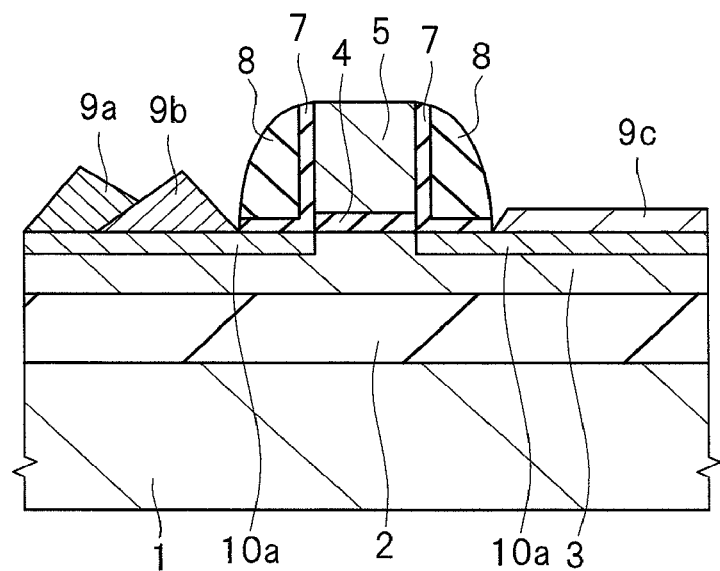
FIG. 19 is a cross-sectional view illustrating a method of manufacturing a semiconductor device as another comparative example.
Figure 20:
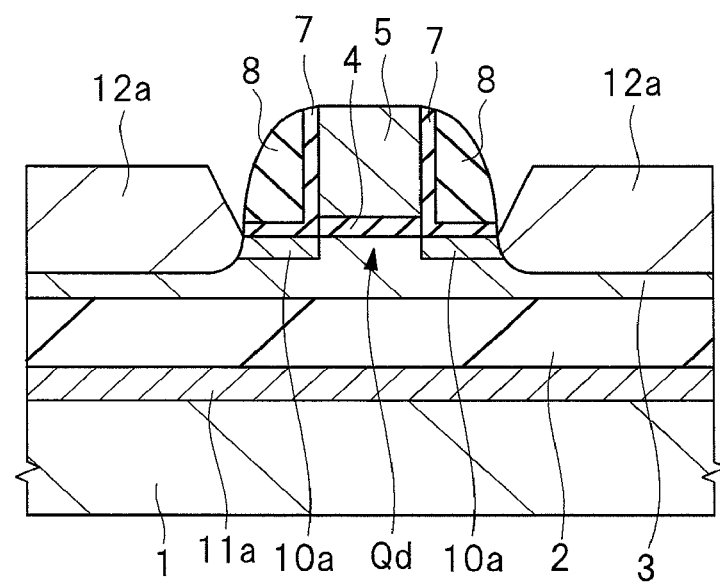
FIG. 20 is a cross-sectional view illustrating a semiconductor device as a comparative example.

Next, effects of the semiconductor device of the present embodiment and the method of manufacturing thereof will be explained by using comparative examples of FIGS. 18 to 20. FIGS. 18 and 19 are cross-sectional views during manufacturing steps of a semiconductor device including a MOSFET as a comparative example, and FIG. 20 is a cross-sectional view of a semiconductor device including a MOSFET Qd as a comparative example.

The following step is conceivable (see FIG. 18) as one of steps of forming a MOSFET on a SOI substrate including the semiconductor substrate 1, the BOX film 2, and the silicon layer 3. That is, first, the gate electrode 5 is formed on the silicon layer 3, and then, the extension region 10a is formed in the upper surface of the silicon layer 3 by performing the ion implantation, and then, the side wall formed of the silicon oxide film 7 and the silicon nitride ($Si_3N_4$) film 8 is formed on the side wall of the gate electrode 5 in the self alignment.

In a subsequent step, for the above-described reasons, an epitaxial layer is formed outside the gate electrode 5 and the side wall by the epitaxial growth method in order to compensate for the film thickness of the silicon layer.

However, if the extension region 10a is formed before the formation of the epitaxial layer, there is a risk that epitaxial layers 9a, 9b, and 9c are not formed to have desired film thicknesses and shapes as illustrated in FIG. 19. That is, as the epitaxial layers 9a and 9b illustrated in FIG. 19, it is conceivable that the epitaxial layers are not uniformly grown on the silicon layer 3 and have variation in crystalline characteristics. Also, as the epitaxial layer 9c, it is conceivable that the epitaxial layer is hardly grown and the layer including the silicon layer 3 and the epitaxial layer 9c cannot obtain a desired film thickness. If the epitaxial layer 9 is excessively thin, there is a risk that the film thickness of the silicon layer including the epitaxial layer 9 is insufficient when the silicide layer is formed on the epitaxial layer 9, and all of the source/drain regions are changed to be silicide.

A reason why the epitaxial layer is not formed in the desired shape as described above is that, when the epitaxial layer is formed on the silicon layer 3 which has been damaged by the ion implantation step for forming the extension region 10a, the epitaxial layer is not grown well due to the damage. If the epitaxial layer is not normally formed, there is a problem that the silicide layer is not formed well and the short-channel characteristics are deteriorated.

On the other hand, as explained with reference to FIGS. 1 to 7, the epitaxial layer 9 can be formed so as to have the desired shape and film thickness on the silicon layer 3 which has not been damaged by the ion implantation for forming the extension region by forming the silicon oxide film 7 and the silicon nitride film 8a on the side wall of the gate electrode 5 before the formation of the epitaxial layer 9, and then, forming the epitaxial layer in that state. Even in a step subsequent to the formation of the epitaxial layer 9, the extension region 10 can be formed in the upper surface of the silicon layer 3 by performing the ion implantation after the silicon nitride film 8a is removed.

Here, in the present embodiment, as explained with reference to FIG. 5, the halo region 11 is formed in the upper surface of the semiconductor substrate 1. As a method of forming the halo region in the upper surface of the semiconductor substrate, as the semiconductor device illustrated in FIG. 20 as the comparative example, it is conceivable to form a halo region (p-type semiconductor region) 11a in the entire upper surface of the semiconductor substrate 1 from above the SOI substrate before the formation of the gate electrode 5 and others, and then, form the gate electrode 5, the extension region 10a, a side wall, an epitaxial layer, and a diffusion layer 12a.

When the halo region is formed in the principal surface of the semiconductor substrate 1, the short-channel characteristics can be suppressed. The short-channel characteristics described here includes deterioration of Lg-Vth characteristics, deterioration of DIBL (Drain Induced Barrier Lowering), and deterioration of an S value (sub-threshold coefficient: sub-threshold slope).

The Lg-Vth characteristics are characteristics determined by a relation between a gate length Lg of the gate electrode and a threshold voltage Vth. When the MOSFET is miniaturized, there is a tendency that an amount of change in the Vth increases depending on a used gate length, and therefore, a problem that the threshold voltage Vth is tend to be varied among MOSFETs arises due to fine variation in the gate length, and reliability of the semiconductor device is deteriorated.

Also, the DIBL is characteristics that change in the threshold voltage Vth increases when a drain voltage of the miniaturized MOSFET increases, and refers to a barrier lowering effect caused by increase in the influence of the drain voltage. If the characteristics are deteriorated due to the channel shortening, the threshold voltage Vth decreases as the drain voltage increases, and a depletion layer of the drain region is extended, and therefore, leakage current between the source/drain regions increases.

Further, the S value represents inverse of a slope of a graph obtained when a relation between the gate voltage Vg and a drain current Id is graphed. When the S value is increased by the channel shortening, rising of a current is gradual, and therefore, a problem of decrease in a current drive force of the MOSFET arises. Still further, when the S value is large, the leakage current in an off state of the MOSFET increases even if the threshold voltage Vth is the same.

These above-described problems of the short-channel characteristics can be improved by forming the halo region in the principal surface of the semiconductor substrate 1. When the halo region is formed in the upper surface of the semiconductor substrate which is the supporting substrate of the SOI substrate, the effect of suppressing the short-channel characteristics particularly described above can be achieved. On the other hand, when the halo region is formed in the deep region away from the upper surface of the semiconductor substrate, the effect of suppressing the short-channel characteristics becomes small.

Still further, as illustrated in the comparative example of FIG. 20, in a case that the halo region 11*a* is formed in a portion in the upper surface of the semiconductor substrate 1 right below the gate electrode 5 and a case that the halo region is formed in other portion than the portion therein right below the gate electrode 5, the short-channel characteristics can be more effectively suppressed in the case that the halo region is formed in other portion in the upper surface of the semiconductor substrate than the portion right below the gate electrode 5.

In the semiconductor device of the present embodiment, as explained with reference to FIG. 5, the halo region 11 is formed by performing the ion implantation with using the gate electrode 5 and the epitaxial layer 9 as the mask, and the halo region is not formed in the portion right below the gate electrode 5, and therefore, the short-channel characteristics can be more effectively suppressed. That is, in the upper surface of the semiconductor substrate 1, the concentration of the impurity that configures the halo region is higher in a region right below the portion between the gate electrode and the epitaxial layer 9 than the portion right below the gate electrode 5, and therefore, the short-channel characteristics can be more effectively suppressed.

Still further, as illustrated in the comparative example of FIG. 20, when the halo region 11*a* is formed in the entire upper surface of the semiconductor substrate 1, the halo region 11*a* to which the impurity has been introduced at the high concentration is formed right below the diffusion layer 12*a* to which the impurity has been introduced at the high concentration via the BOX film 2. In this case, a diffusion capacitance (parasitic capacitance, junction capacitance) is generated between the diffusion layer 12*a* and the halo region 11*a*. Therefore, particularly in a MOSFET having a high operating frequency, signal noise, delay, or others is significantly generated.

As one structure for preventing the generation of the capacitance, a structure is conceivable, in which the halo region is not formed right below the diffusion layer 12 which configures the source/drain regions. In the present embodiment, as explained with reference to FIG. 5, the halo region 11 is formed by performing the ion implantation with using the gate electrode 5 and the epitaxial layer 9 as the mask, and the halo region is not formed right below the epitaxial layer 9. Therefore, the generation of the diffusion capacitance between the diffusion layer 12 and the semiconductor substrate 1 can be prevented.

Note that, if ion implantation which forms the halo region in the entire upper surface of the semiconductor substrate is performed from the upper surface of the SOI substrate before the formation of the gate electrode, the side wall, and others, the problems that the short-channel characteristics and the diffusion capacitance occur arise as described above. On the other hand, if the halo region is not formed in the entire upper surface of the semiconductor substrate but formed in only a predetermined region inside the semiconductor substrate by performing the ion implantation with using a photoresist film or others as a mask, the occurrence of the above-described problems can be avoided. However, when this method is used, it is required to prepare the mask used in the ion implantation step of forming the halo region and to increase a step of forming the photoresist film, and therefore, a manufacturing cost of the semiconductor device is increased.

In the present embodiment, the ion implantation of forming the halo region is performed with using the gate electrode illustrated in FIG. 5 and the epitaxial layer 9 which has been formed in the self alignment as the mask, and therefore, it is not required to newly prepare the mask, and the manufacturing steps of the semiconductor device can be simplified, and the increase in the manufacturing cost of the semiconductor device can be prevented.

Second Embodiment

In the above-described first embodiment, the method of forming the MOSFET by a gate first process in which the source/drain regions are formed after the gate electrode is formed has been explained. In the present embodiment, a MOSFET formed by a gate last process, in which the gate electrode is formed after the source/drain regions are formed will be explained.

Hereinafter, FIGS. 8 to 12 illustrate cross-sectional views during manufacturing steps of a semiconductor device of the present embodiment.

First, as similarly to the above-described first embodiment, the SOI substrate including the semiconductor substrate 1, the BOX film 2 formed on the semiconductor substrate 1, and the silicon layer 3 formed on the BOX film 2 is prepared. Then, steps almost similar to the steps explained with reference to FIGS. 1 and 2 are performed.

Note that, in the steps explained with reference to FIGS. 1 and 2, the gate electrode 5 formed of the polysilicon film is formed. However, here, instead of the gate electrode 5, for example, a dummy gate electrode (sacrifice pattern) D5 formed of a polysilicon film is formed. A material and a pattern shape of the dummy gate electrode D5 are the same as those of the gate electrode 5 of the above-described embodiment. Also, the gate insulating film 4 (see FIG. 1) is not formed. Further, the implantation of the impurity for forming the extension region 10 is performed after the formation of the dummy gate electrode D5 but before the formation of the side wall formed of the silicon oxide film 7 and the silicon nitride film 8*a*. In this manner, the extension region 10 to which an n-type impurity (for example, As (arsenic)) is implanted at a relatively low concentration is formed in the upper surface of the silicon layer 3 on both sides of the dummy gate electrode D5.

That is, here, after a pattern formed of a stacked film formed of the dummy gate electrode D5 and the silicon nitride film 6 is formed on the SOI substrate, and then, the extension region 10 is formed, and a sidewall formed of the silicon oxide film 7 and the silicon nitride film 8*a* is subsequently formed on a side wall of the dummy gate electrode D5. Subsequently, the epitaxial layer 9 is formed on the silicon layer 3 that is exposed from the side wall and the dummy gate electrode D5.

Figure 8:
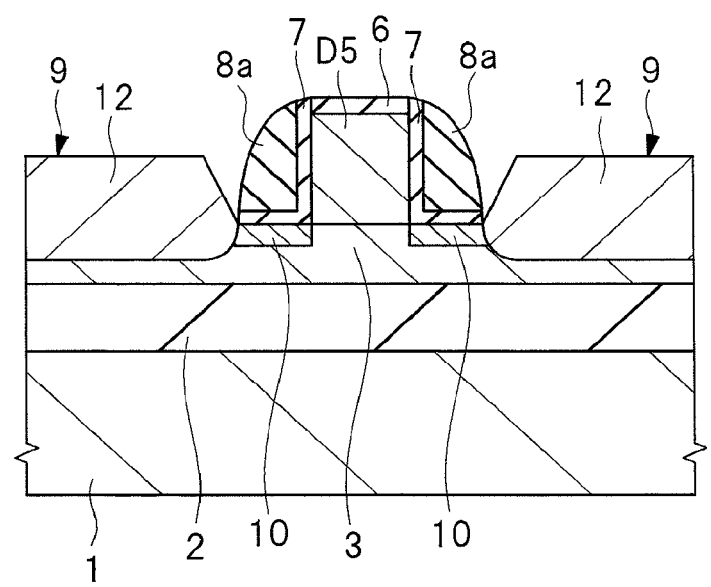
FIG. 8 is a cross-sectional view illustrating a method of manufacturing a semiconductor device according to a second embodiment of the present invention.

Then, an n-type impurity (for example, As (arsenic)) is ion-implanted into the epitaxial layer 9 at a relatively high concentration, so that the diffusion layer 12 is formed inside the epitaxial layer 9 that is exposed from the dummy gate electrode D5, the silicon oxide film 7 and the silicon nitride film 8*a*. In this manner, a structure illustrated in FIG. 8 is obtained. The extension region 10 and the diffusion layer 12 configure source/drain regions of a MOSFET Qb (see FIG. 12) which will be formed later.

Figure 9:
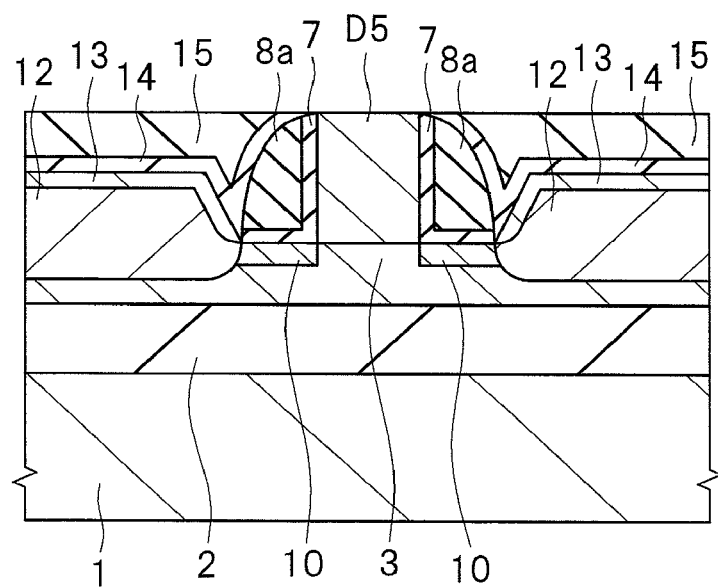
FIG. 9 is a cross-sectional view illustrating the method of manufacturing the semiconductor device continued from FIG. 8.

Next, as illustrated in FIG. 9, a silicide layer 13 is formed on the surface of the diffusion layer 12 by using an already-known salicide technique. The silicide layer 13 is a conductive film made of cobalt silicide (CoSi). At this time, an upper surface of the dummy gate electrode D5 is covered with the silicon nitride film 6, and therefore, the silicide layer is not formed on the upper surface of the dummy gate electrode D5.

Then, an etching stopper film (liner insulating film) 14 and an interlayer insulating film 15 are sequentially formed so as to cover the silicon layer 3, the silicide layer 13, the side wall, the silicon nitride film 6, and the source/drain regions by using, for example, the CVD method. The etching stopper film 14 is a film which functions as an etching stopper film in an etching step of forming a contact hole for burying a contact plug to be electrically connected to the diffusion layer 12 in a later step, and is formed of, for example, a silicon nitride ($Si_3N_4$) film. Also, the interlayer insulating film 15 is formed of, for example, a silicon oxide film, and an upper surface thereof is positioned in a region higher than at least the upper surface of the dummy gate electrode D5.

Subsequently, the interlayer insulating film 15, the etching stopper film 14, and the silicon nitride film 6 are polished by using a CMP (Chemical Mechanical Polishing) method, so that the upper surface of the dummy gate electrode D5 is exposed, and upper-surface heights of the dummy gate electrode D5, the etching stopper film 14, and the interlayer insulating film 15 are uniformed.

Figure 10:
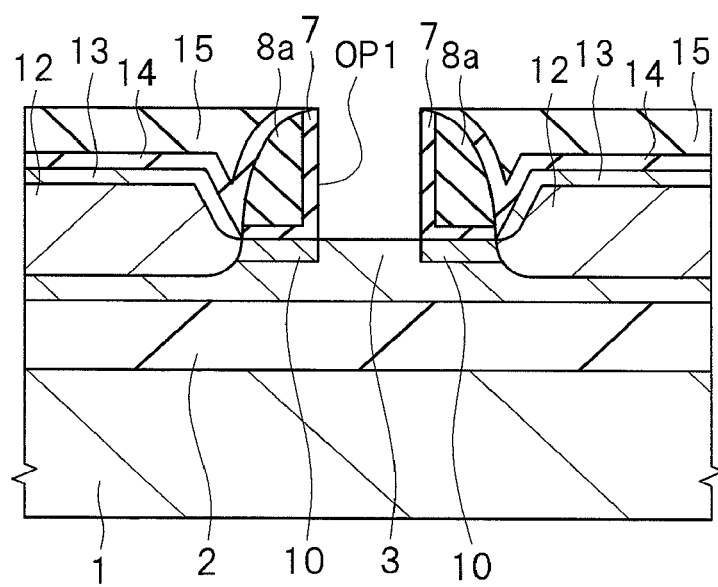
FIG. 10 is a cross-sectional view illustrating the method of manufacturing the semiconductor device continued from FIG. 9.

Next, as illustrated in FIG. 10, the dummy gate electrode D5 is selectively removed by using, for example, a wet etching method. In this manner, an opening portion OP1 of an insulating film is formed in a region from which the dummy gate electrode D5 has been removed, so that the upper surface of the silicon layer 3 is exposed from a bottom surface of the opening portion OP1. The opening portion OP1 described here is an opening portion of the insulating film formed of the etching stopper film 14, the interlayer insulating film 15, the silicon oxide film 7, and the silicon nitride film 8a, and a side wall of the silicon oxide film 7 is exposed from a side wall of the opening portion OP1.

Figure 11:
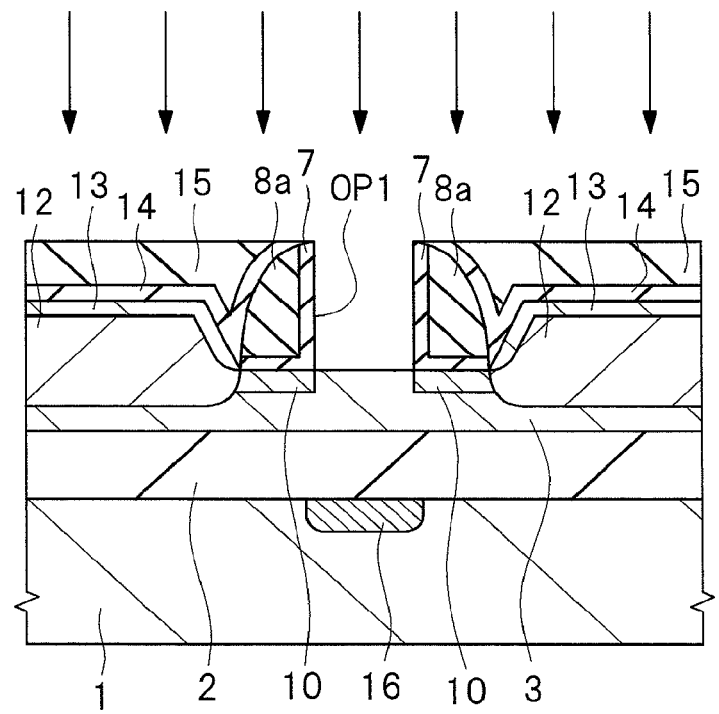
FIG. 11 is a cross-sectional view illustrating the method of manufacturing the semiconductor device continued from FIG. 10.

Next, as illustrated in FIG. 11, an impurity (for example, B (boron) or P (phosphorous)) is ion-implanted into the principal surface of the semiconductor substrate 1, so that a halo region 16 obtained by implanting the impurity into the upper surface of the semiconductor substrate 1 is formed. Here, the above-described ion implantation is performed in a direction perpendicular to the principal surface of the semiconductor substrate 1, so that the impurity is implanted into the principal surface of the semiconductor substrate 1 so as to pass through the silicon layer 3 at the bottom surface of the opening portion OP1 and through the BOX film 2 therebelow.

At this time, the semiconductor substrate 1 and the silicon layer 3 in other region than the opening portion OP1 from which the dummy gate electrode D5 has been removed are covered with the interlayer insulating film 15, the etching stopper film 14, the silicide layer 13, the silicon oxide film 7, and the silicon nitride film 8a, and therefore, the impurity is not implanted into the semiconductor substrate 1 and the silicon layer 3 in this region. Also, the diffusion layer 12 is covered with the interlayer insulating film 15, the etching stopper film 14, and the silicide layer 13, and therefore, the impurity is not implanted thereto.

Figure 12:
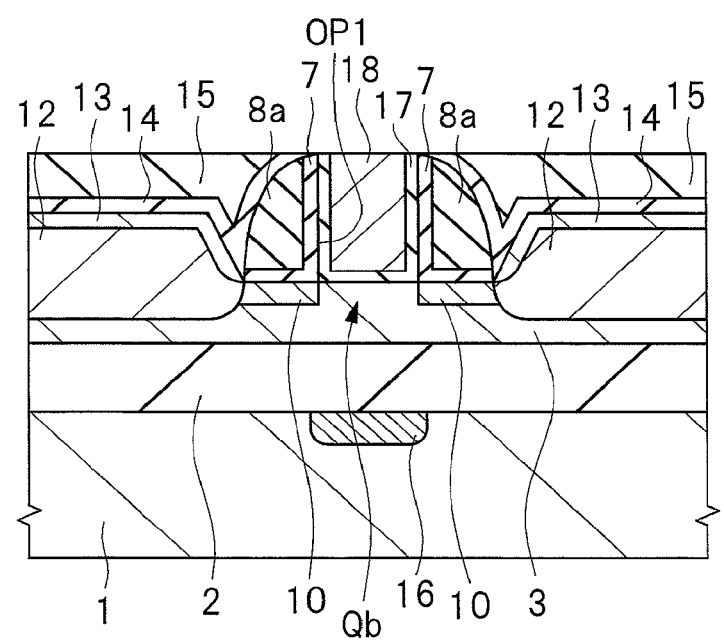
FIG. 12 is a cross-sectional view illustrating the method of manufacturing the semiconductor device continued from FIG. 11.

Next, as illustrated in FIG. 12, a gate insulating film 17 and a gate electrode 18 are formed so as to be buried inside the opening portion OP1. In this case, first, a high dielectric-constant insulating film is formed on the entire upper surface of the semiconductor substrate 1 so as to cover the bottom surface of the opening portion OP1 and an inner wall thereof by using, for example, an ALD (Atomic Layer Deposition) method or the CVD method. Subsequently, a metal film is formed so as to completely bury the inside of the opening portion OP1 by using a sputtering method or others. The above-described metal film is formed of, for example, a TiN film.

The high dielectric-constant insulating film is an insulating film containing Hf, is made of an insulating material containing Hf (hafnium), and can be, for example, a. HfSiON film (hafnium silicon oxynitride film), a HfON film (hafnium oxynitride film), or a HfO film (hafnium oxide film, typically, $HfO_2$ film). When the high dielectric-constant film is the HfSiON film, a HfSiO film is deposited first by using the ALD (Atomic Layer Deposition) method or the CVD method. Then, this HfSiO film is nitrided by a nitriding process, so that the HfSiON film can be formed.

Next, an unnecessary part of the above-described metal film on the interlayer insulating film and an unnecessary part of the above-described high dielectric-constant insulating film are removed by polishing them by using the CMP method, so that the upper surface of the interlayer insulating film 15 is exposed. In this manner, the above-described metal film and the above-described high dielectric-constant insulating film are buried so as to remain only inside the opening portion OP1, and a gate insulating film 17 formed of the above-described high dielectric-constant insulating film and a gate electrode 18 formed of the above-described metal film are formed. That is, by the above-described polishing step, upper-surface heights of the gate electrode 18 and the interlayer insulating film 15 are uniformed. At this time, between the side walls of the interlayer insulating film 15 which are opposed to each other so as to sandwich the opening portion OP1, the etching stopper film 14, the silicon nitride film 8a, the silicon oxide film 7, the gate insulating film 17, and the gate electrode 18 are sequentially formed in this order from each of the both side walls of the interlayer insulating film 15.

The gate insulating film 17 is continuously formed inside the opening portion OP1 so as to be along the upper surface of the silicon layer 3 and the side wall of the silicon oxide film 7. Therefore, the gate insulating film 17 is formed between the silicon layer 3 and the gate electrode 18, and the gate insulating film 17 covering the side wall of the gate electrode 18 is formed between the silicon oxide film 7 and the gate electrode 18. Therefore, the gate electrode 18, the silicon layer 3, and the silicon oxide film 7 are not in contact with each other, and are electrically insulated from each other. In this manner, the n-channel-type MOSFET Qb including the gate electrode 18, the extension region 10, and the diffusion layer 12 is formed.

Detailed explanations and illustrations of subsequent steps will be omitted. However, an interlayer insulating film is further formed on the interlayer insulating film 15 and on the gate electrode 18, and then, a contact plug penetrating through this interlayer insulating film and the interlayer insulating film 15 is formed, and the contact plug is connected to the silicide layer 13 and the gate electrode 18. Subsequently, a wiring connected to an upper surface of the above-described contact plug is formed, so that the semiconductor device of the present embodiment is completed.

Note that the step of forming the silicide layer on the upper surface of the gate electrode 18 is not required.

Through the ion implantation step explained with reference to FIG. 11, the MOSFET Qb formed by the above-described manufacturing steps has the halo region 16 in a portion of the upper surface of the semiconductor substrate 1 which is right below the opening portion OP1, that is, right below the gate electrode 18 illustrated in FIG. 12. The halo region 16 is not formed in a region of the principal surface of the semiconductor substrate 1 which is covered with the etching stopper film 14, the interlayer insulating film 15, the silicon oxide film 7, and the silicon nitride film 8a.

This is because the impurity for configuring the halo region 16 is not implanted into the region of the semiconductor region 1 which is covered with the etching stopper film 14 and the interlayer insulating film 15 through the ion implantation step explained with reference to FIG. 11. Therefore, the halo region 16 is not formed in the portion of the principal surface of the semiconductor substrate 1 which is right below the diffusion layer 12 formed beside the gate electrode 18 illustrated in FIG. 12.

That is, in a first region of the upper surface of the semiconductor substrate 1 which is right below the gate electrode 18, a concentration of the n-type or the p-type impurity which has been implanted in the ion implantation step explained with reference to FIG. 11 is higher than in a second region adjacent to the first region in the upper surface of the semiconductor substrate 1. Note that the first region and the second region described here are arranged to be align in a gate-length direction (first direction) of the gate electrode 18 as similar to the extension region 10, the diffusion layer 12, and the gate electrode 18. Here, although the gate electrode 18 is not formed right above the second region, the source/drain regions are formed right above the second region.

As described above, the halo region 16 is a semiconductor region formed for adjusting and improving the Lg-Vth characteristics of the MOSFET Qb. That is, the formation of the halo region 16 can prevent the occurrence of the phenomenon caused due to the channel shortening which decreases the threshold voltage Vth when the drain voltage increases, resulting in the extension of the depletion layer of the drain region to increase the leakage current between the source/drain regions.

As the method of forming the halo region in the upper surface of the semiconductor substrate, the following method is conceivable. That is, as similar to the semiconductor device illustrated as the comparative example in FIG. 20, it is conceivable to form a halo region 11a by performing ion implantation into the entire upper surface of the semiconductor substrate 1 from above the SOI substrate before the formation of the gate electrode 5, the diffusion layer 12a, and others, and then, form the gate electrode 5, the extension region 10a, the side wall, the epitaxial layer, the diffusion layer 12a, and others.

Also, when the gate last process is used as similar to the present embodiment, it is conceivable to form the halo region (not illustrated) in the entire principal surface of the semiconductor substrate 1 by performing the ion implantation into the semiconductor substrate 1 after the preparation of the SOI substrate but before the formation of the dummy gate electrode D5, the epitaxial layer 9, and the diffusion layer 12 (see FIG. 8). In this case, the halo region is formed, via the BOX film 2, right below the region to which the n-type impurity (for example, As (arsenic)) has been introduced at the high concentration as similar to the diffusion layer 12 (see FIG. 8).

When the halo region is formed in the entire principal surface of the semiconductor substrate 1 as described above, a diffusion capacitance (parasitic capacitance, junction capacitance) is generated between the diffusion layer 12 and the halo region formed via the BOX film 2 therebetween, and therefore, signal noise or delay is generated when the MOSFET is operated.

On the other hand, in the semiconductor device of the present embodiment, through the step of forming the MOSFET Qb by using the gate last process, the halo region 16 is formed in only the portion of the upper surface of the semiconductor substrate 1 which is right below the opening portion OP1 by performing the ion implantation into the opening portion OP1 (see FIG. 1) where the dummy gate electrode D5 has been removed. Therefore, the halo region 16 is not formed in the portion of the upper surface of the semiconductor substrate 1 which is right below the diffusion layer 12. In this manner, the provision of the halo region can suppress the short-channel effect and obtain the effect capable of adjusting the threshold voltage Vth, and besides, can prevent the occurrence of of the diffusion capacitance between the diffusion layer 12 and the semiconductor substrate 1.

Also, in the present embodiment, the halo region is not formed in only the portions of the principal surface of the semiconductor substrate 1 which are below the both side walls (both ends) of the gate electrode 18, but the halo region 16 is formed in the portion of the entire principal surface of the semiconductor substrate 1 which is right below the gate electrode 18. In the case that the halo region 16 is formed in the portion of the entire principal surface of the semiconductor substrate 1 which is right below the gate electrode 18 as described above, the impurity for configuring the halo region 16 is uniformly distributed below the gate electrode 18, and therefore, the variation in the threshold voltage can be suppressed and the deterioration of the DIBL can be prevented further than those in the case that the halo region is formed in only the portions of the principal surface of the semiconductor substrate 1 which are below the both side walls (both ends) of the gate electrode 18.

Third Embodiment

In the present embodiment, the case that the MOSFET is formed by the gate last process as similar to the above-described second embodiment will be explained. Hereinafter, a step of manufacturing a semiconductor device of the present embodiment, which form a halo region in only portions which are right below both ends of a gate electrode by performing ion implantation into a region from which an offset spacer has been removed will be explained with reference to FIGS. 13 to 17. FIGS. 13 to 17 are cross-sectional views for explaining the step of manufacturing the semiconductor device of the present embodiment.

Figure 13:
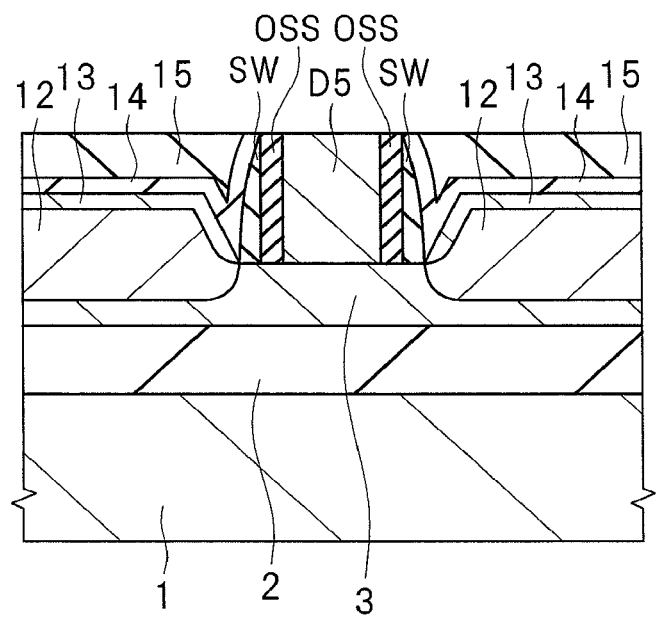
FIG. 13 is a cross-sectional view illustrating a method of manufacturing a semiconductor device according to a third embodiment of the present invention.

First, as illustrated in FIG. 13, the SOI substrate including the semiconductor substrate 1, the BOX film 2, and the silicon layer 3 is prepared as similar to those of the above-described first and second embodiments. Subsequently, a polysilicon film and the silicon nitride film 6 (not illustrated) are formed on the silicon layer 3 by the CVD method or others, and then, the silicon nitride film 6 (not illustrated) is patterned, and the polysilicon film is processed with using the patterned silicon nitride film 6 (not illustrated) as a hard mask, so that the dummy gate electrode (sacrifice pattern) D5 is formed of the polysilicon film.

Subsequently, an insulating film is formed on the silicon layer 3 so as to cover an upper surface of the dummy gate electrode D5 and a side surface thereof by using the CVD method or others. Then, by performing anisotropic etching, the upper surface of the dummy gate electrode D5 and the upper surface of the silicon layer 3 are exposed, and an offset spacer OSS formed of an insulating film is formed on the side wall of the dummy gate electrode D5 in self alignment. As a material of the offset spacer, for example, silicon germanium (SiGe), titanium nitride (TiN), or others can be used.

Subsequently, for example, a side wall SW including a silicon oxide film is formed on the side wall of the offset spacer OSS. The side wall SW can be formed by, for example, forming a stacked film formed of a silicon oxide film and a silicon nitride film on the entire upper surface of the semiconductor substrate 1 by the CVD method or others, and then, partially removing the stacked film by anisotropic etching. Subsequently, the epitaxial layer 9 is formed by an epitaxial growth method on the upper surface of the silicon layer 3 exposed from the dummy gate electrode D5, the offset spacer OSS, and the side wall SW. At this time, the epitaxial layer is not formed on an upper surface of the dummy gate electrode D5 since the upper surface of the dummy gate electrode D5 is covered with the silicon nitride film 6 (not illustrated). Subsequently, an n-type impurity (for example, As (arsenic)) is ion-implanted into the epitaxial layer 9 at a relatively high concentration, so that the diffusion layer 12 which is the n-type semiconductor layer is formed inside the epitaxial layer 9.

Subsequently, as similar to the step explained in the above-described second embodiment with reference to FIG. 9, the silicide layer 13, the etching stopper film 14, and the interlayer insulating film 15 are formed, and a part of the etching stopper film 14 and the interlayer insulating film 15 and the silicon nitride film 6 (not illustrated) are removed by a polishing step with using, for example, the CMP method, so that an upper surface of the dummy gate electrode D5 and an upper surface of the offset spacer OSS are removed.

That is, the silicide layer 13 is formed on the surface of the diffusion layer 12 by using the publicly-known salicide technique, and then, the etching stopper film 14 and the interlayer insulating film 15 are sequentially formed by using the CVD method or others so as to cover the diffusion layer 12, the silicide layer 13, the side wall SW, the offset spacer OSS, and the silicon nitride film 6 (not illustrated). Then, the etching stopper film 14, a part of the interlayer insulating film 15, and the silicon nitride film (not illustrated) are polished by using, for example, the CMP method, so that upper-surface heights of the interlayer insulating film 15, the dummy gate electrode D5, and the offset spacer OSS are uniformed.

Figure 14:
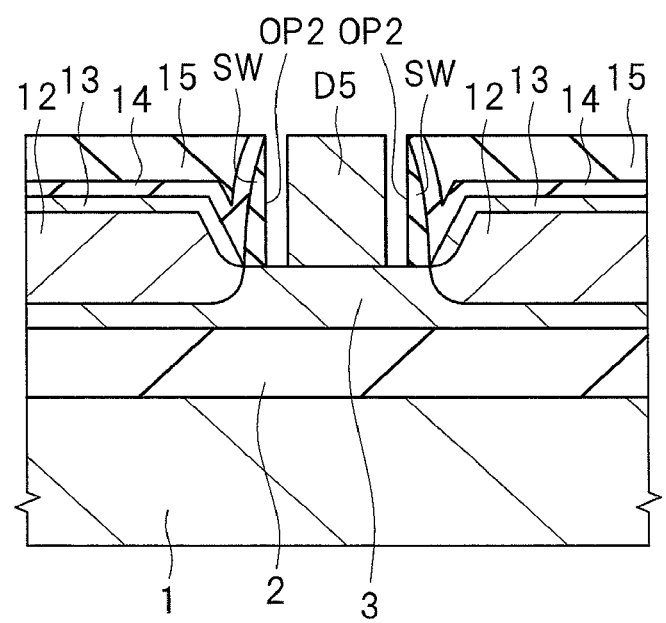
FIG. 14 is a cross-sectional view illustrating the method of manufacturing the semiconductor device continued from FIG. 13.

Next, as illustrated in FIG. 14, the offset spacer OSS is selectively removed by the wet etching method or others, so that the upper surface of the silicon layer 3 beside the dummy gate electrode D5 is exposed. When the offset spacer OSS is formed of the titanium nitride (TiN) film, the offset spacer OSS is removed by using, for example, a SPM (sulfuric acid hydrogen peroxide mixture) solution which is mixed liquid of concentrated sulfuric acid and hydrogen peroxide. In this manner, an opening portion OP2 is formed in a region from which the offset spacer OSS is removed. Inside the opening portion OP2, both side walls of the dummy gate electrode D5 and a side wall of the side wall SW are exposed. That is, the opening portion OP2 is formed between the dummy gate electrode D5 and the side wall SW, the etching stopper film 14, and the interlayer insulating film 15.

Figure 15:
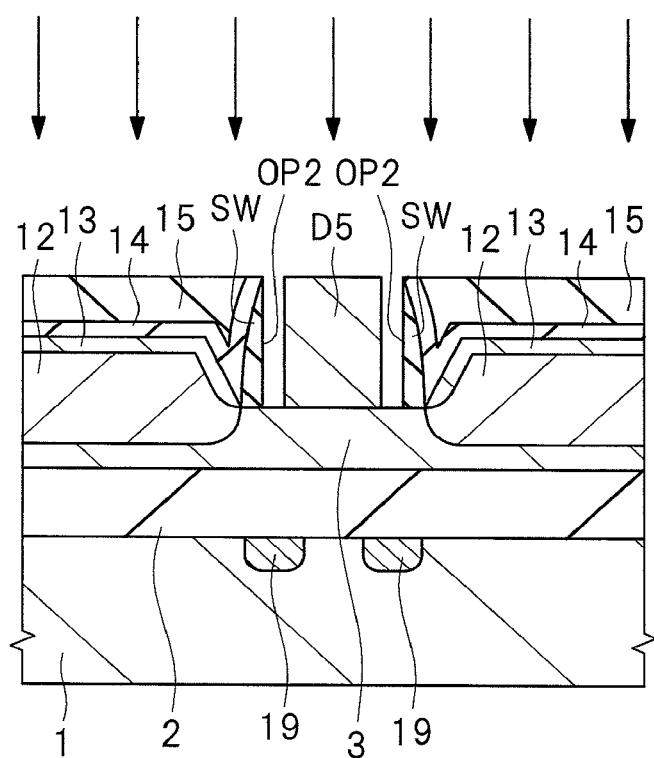
FIG. 15 is a cross-sectional view illustrating the method of manufacturing the semiconductor device continued from FIG. 14.

Next, as illustrated in FIG. 15, an impurity (for example, B (boron) or P (phosphorous)) is ion-implanted toward the principal surface of the semiconductor substrate 1, so that a halo region 19 obtained by implanting the above-described impurity into the upper surface of the semiconductor substrate 1 is formed. Here, the above-described ion implantation is performed from the direction perpendicular to the principal surface of the semiconductor substrate 1, and the above-described impurity is implanted into the principal surface of the semiconductor substrate 1 so as to pass through the silicon layer 3 at the bottom surface of the opening portion OP2 and the BOX film 2 therebelow. In this manner, the halo region 19 is formed in only a region of the principal surface of the semiconductor substrate 1 which is right below the opening portion OP2.

That is, the above-described ion implantation is performed with using the dummy gate electrode D5, the etching stopper film 14, and the interlayer insulating film 15 as a mask, and therefore, the halo region 19 is not formed in the entire upper surface of the semiconductor substrate 1 but formed in only the portion of the principal surface of the semiconductor substrate 1 which is beside and right below the dummy gate electrode D5. Therefore, in the portions of the principal surface of the semiconductor substrate 1 which are right below the dummy gate electrode D5 and right below the diffusion layer 12, there are regions to which the impurity for configuring the halo region 19 has not been introduced.

Figure 16:
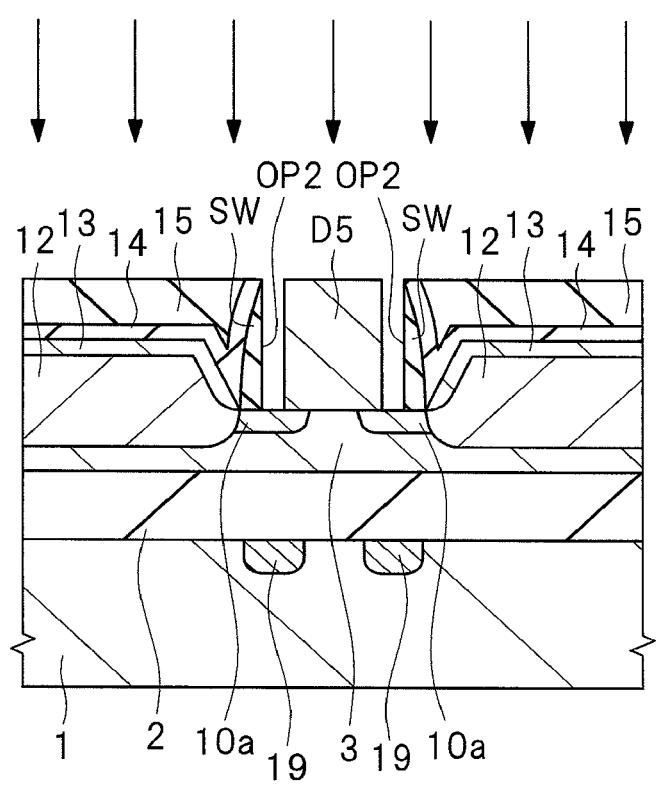
FIG. 16 is a cross-sectional view illustrating the method of manufacturing the semiconductor device continued from FIG. 15.

Next, as illustrated in FIG. 16, an n-type impurity (for example, As (arsenic)) is ion-implanted toward the upper surface of the silicon layer 3, so that the extension region 10a to which the above-described impurity has been implanted is formed in the silicon layer 3. The extension region 10a is formed right below the opening portion OP2, and there is a region right below the dummy gate electrode D5 where the extension region 10a is not formed. That is, the extension region 10a is formed in only a portion of the silicon layer 3 which is beside the dummy gate electrode D5. In this manner, beside the dummy gate electrode D5, the source/drain regions having a LDD structure including the extension region 10a having the relatively low impurity concentration and the diffusion layer 12 having the relatively high impurity concentration are formed.

Note that either of the step of forming the halo region 19 explained with reference to FIG. 15 and the step of forming the extension region 10a explained with reference to FIG. 16 may be performed first. Also, the step of forming the extension region 10a by performing the ion implantation from the opening portion OP2 has been explained here. However, as similar to the above-described second embodiment, the extension region 10a may be formed inside the silicon layer by performing the ion implantation at a stage after the formation of the dummy gate electrode but before the formation of the side wall. In that case, the ion implantation explained with reference to FIG. 16 is not performed.

Figure 17:
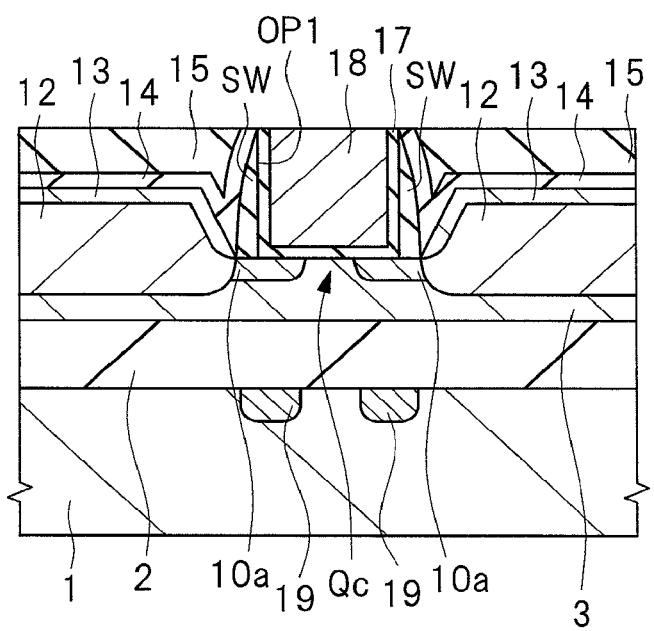
FIG. 17 is a cross-sectional view illustrating the method of manufacturing the semiconductor device continued from FIG. 16.

Next, by performing the steps explained with reference to FIGS. 10 and 12, a MOSFET Qc illustrated in FIG. 17 is formed. That is, the dummy gate electrode D5 is removed, and then, the gate insulating film 17 and the gate electrode 18 are formed without performing the ion implantation step as explained with reference to FIG. 11.

More specifically, after the opening portion OP1 is formed by removing the dummy gate electrode D5, and a high dielectric-constant insulating film and a metal film are sequentially formed on the entire principal surface of the semiconductor substrate 1, and then, the high dielectric-constant insulating film and the metal film are polished by the CMP method or others so as to expose the upper surface of the interlayer insulating film 15. That is, the gate insulating film 17 formed of the high dielectric-constant insulating film is formed so as to cover the side wall and the bottom surface inside the opening portion OP1, and the gate electrode 18 formed of the metal film is formed so as to completely bury the inside of the opening portion OP1 together with the gate insulating film 17. In this manner, the n-channel-type MOSFET Qc including the gate electrode 18, the extension region 10a, and the diffusion layer 12 is formed.

Detailed explanations and illustrations of subsequent steps will be omitted. However, after an interlayer insulating film is further formed on the interlayer insulating film 15 and the gate electrode 18, and then, a contact plug penetrating through this interlayer insulating film and the interlayer insulating film 15 is formed, and the contact plug is connected to the silicide layer 13 and the gate electrode 18. Subsequently, a wiring connected to an upper surface of the contact plug is formed, so that the semiconductor device of the present embodiment is completed. Note that the step of forming the silicide layer on the upper surface of the gate electrode 18 is not required.

Although the semiconductor device of the present embodiment has a structure almost the same as that of the semiconductor device explained in the above-described second embodiment, this is different from that of the above-described second embodiment in the point that the portion of the principal surface of the semiconductor substrate 1 which is right below the gate electrode 18 has a region where the halo region 19 is not formed. That is, in the MOSFET Qc in the semiconductor device of the present embodiment, as different from the above-described second embodiment, the halo region 19 is formed in only the portion of the principal surface of the semiconductor substrate 1 which is below the both side walls (both ends) of the gate electrode 18.

In other words, the halo region 19 is formed in only a second region in the present embodiment when it is assumed that the portion of the upper surface of the semiconductor substrate 1 which is right below the gate electrode 18 is a first region, that the upper surface of the semiconductor substrate 1 includes the second region adjacent to the first region in a gate-length direction (first direction) of the gate electrode 18, and that the upper surface of the semiconductor substrate 1 includes third regions so as to sandwich the first region and the second region in the same direction. That is, a portion of the upper surface of the semiconductor substrate 1 which is right below the offset spacer OSS (see FIG. 13) is the second region, and portions of the upper surface of the semiconductor substrate 1 which are right below the source/drain regions are the third regions. In this case, the concentration of the n-type or p-type impurity implanted in the ion implantation step explained with reference to FIG. 15 is higher in the second region than any other regions of the first region and the third region.

As described above, when the halo region 19 is formed in the portion of the principal surface of the semiconductor substrate 1 which is right below the diffusion layer 12, there is a problem that the diffusion capacitance (parasitic capacitance, junction capacitance) between the diffusion layer 12 and the halo region 19 is increased. On the other hand, in the present embodiment, the halo region 19 is not formed right below the diffusion layer 12, and therefore, occurrence of signal noise or delay of the MOSFET due to the increase in the diffusion capacitance can be prevented. Also, the short-channel characteristics can be suppressed by forming the halo region 19 in the principal surface of the semiconductor substrate 1.

In the foregoing, the invention made by the present inventors has been concretely described based on the embodiments. However, it is needless to say that the present invention is not limited to the foregoing embodiments and various modifications and alterations can be made within the scope of the present invention.

For example, in the above-described first to third embodiments, the case that the n-channel-type MOSFET is formed on the semiconductor substrate has been explained. However, the semiconductor element may be a p-channel-type MOSFET or may be a MIS (Metal Insulator Semiconductor) type FET.

Also, the halo region of the above-described first embodiment has been explained as the p-type semiconductor region. However, the conductivity types of the halo regions of the above-described first to third embodiments may be the same conductivity type as that of a channel of the MOSFET thereon or a different conductivity type therefrom.

In addition, a part of the contents described in the embodiments will be described below.

(1) A method of manufacturing a semiconductor device including:

(a) a step of preparing a semiconductor substrate formed of a supporting substrate, a first insulating film formed on the supporting substrate, and a semiconductor layer formed on the first insulating film, the supporting substrate having a first region and a second region adjacent to each other in a first direction in an upper surface thereof;

(b) a step of forming a first film on the semiconductor layer;

(c) a step of forming a sacrifice pattern formed of the first film right above the first region by processing the first film;

(d) a step of forming an epitaxial layer on a portion of the semiconductor layer which is exposed from the sacrifice pattern;

(e) a step of forming a pair of source/drain regions sandwiching the sacrifice pattern therebetween in the first direction by introducing an impurity of a first conductivity type into the epitaxial layer;

(f) a step of forming a second insulating film on the semiconductor layer so as to cover the source/drain regions and the semiconductor layer;

(g) a step of forming an opening portion, which exposes an upper surface of the semiconductor layer, in the second insulating film by partially removing an upper surface of the second insulating film and removing the exposed sacrifice pattern;

(h) after the step of (g), a step of forming a first diffusion layer by introducing an impurity of the first conductivity type or a second conductivity type into the first region right below the opening portion from above the supporting substrate; and (i) after the step of (h), a step of forming a gate electrode via a gate insulating film on the semiconductor layer at a bottom portion of the opening portion.

(2) In the method of manufacturing the semiconductor device according to item (1), the source/drain regions are formed right above the second regions, and a concentration of the impurity of the first conductivity type or the second conductivity type introduced into the upper surface of the supporting substrate is higher in the first region than the second regions.

(3) A method of manufacturing a semiconductor device including:

(a) a step of preparing a semiconductor substrate formed of a supporting substrate, a first insulating film formed on the supporting substrate, and a semiconductor layer formed on the first insulating film, the supporting substrate having a first region and a second region adjacent to each other in a first direction in an upper surface thereof;
(b) a step of forming a first film on a portion of the semiconductor layer which is right above the first region;
(c) a step of forming a sacrifice pattern formed of the first film right above the first region by processing the first film;
(d) a step of forming a third insulating film which covers a side wall of the sacrifice pattern and is in contact with an upper surface of the semiconductor layer;
(e) a step of forming an epitaxial layer on a portion of the semiconductor layer which is exposed from the sacrifice pattern and the third insulating film;
(f) a step of forming a pair of source/drain regions sandwiching the sacrifice pattern therebetween in the first direction by introducing an impurity of a first conductivity type into the epitaxial layer;
(g) a step of forming a second insulating film on the semiconductor layer so as to cover the source/drain regions and the semiconductor layer;
(h) a step of forming a first opening portion, which exposes the upper surface of the semiconductor layer, between the second insulating film and the sacrifice pattern by partially removing an upper surface of the second insulating film and removing the exposed third insulating film;
(i) after the step of (h), a step of forming a first diffusion layer by introducing an impurity of the first conductivity type or a second conductivity type into the second region right below the first opening portion from above the supporting substrate;
(j) after the step of (i), a step of forming a second opening portion, which exposes the upper surface of the semiconductor layer, in the second insulating film by removing the sacrifice pattern; and
(k) a step of forming a gate electrode via a gate insulating film on the semiconductor layer at a bottom portion of the second opening portion.
(4) In the method of manufacturing the semiconductor device according to item (3),
a concentration of the impurity of the first conductivity type or the second conductivity type introduced into the upper surface of the supporting substrate is higher in the second region than the first region.
(5) In the method of manufacturing the semiconductor device according to item (3),
the source/drain regions are formed right above third regions formed in the upper surface of the supporting substrate so as to sandwich the first region and the second region therebetween in the first direction, and
a concentration of the impurity of the first conductivity type or the second conductivity type introduced into the upper surface of the supporting substrate is higher in the second region than the third regions.
(6) In the method of manufacturing the semiconductor device according to item (3),
after the step of (h) but before the step of (j), the method includes a step of forming an extension region by introducing an impurity of the first conductivity type into the semiconductor layer right below the first opening portion from above the supporting substrate at a concentration lower than that of the epitaxial layer.

What is claimed is:
1. A method of manufacturing a semiconductor device including a semiconductor substrate, a first insulating film formed over the semiconductor substrate and a semiconductor layer formed over the first insulating film, comprising steps of:
(a) forming a gate insulating film of a field effect transistor over the semiconductor layer;
(b) forming a gate electrode of the field effect transistor over the gate insulating film;
(c) forming a second insulating film over the semiconductor layer and a side surface of the gate electrode;
(d) providing a first side wall including the second insulating film and a third insulating film by forming the third insulating film over the semiconductor layer and the side surface of the gate electrode through the second insulating film, the third insulating film made of a different material from the second insulating film;
(e) after the step (d), forming an epitaxial layer over the semiconductor layer and a side of the first side wall;
(f) after the step (e), removing the third insulating film such that the second insulating film located between the semiconductor layer and the third insulating film is remained;
(g) after the step (f), forming a first impurity region of a first conductivity type in the first semiconductor layer through the second insulating film by an ion implantation method;
(h) after the step (g), providing a second side wall including the second insulating film and a fourth insulating film by forming the fourth insulating film over the semiconductor layer and the side surface of the gate electrode through the second insulating film, the fourth insulating film made of a different material from the second insulating film; and
(i) after the step (h), forming a second impurity region of the first conductivity type in the epitaxial layer and the first semiconductor layer by an ion implantation method,
wherein the first impurity region is a part of a source region of the field effect transistor or a part of a drain region of the field effect transistor, and
wherein the second impurity region is a part of the source region of the field effect transistor or a part of the drain region of the field effect transistor, and has larger impurity concentration than the first impurity region.
2. A method of manufacturing a semiconductor device according to claim 1, further comprising a step of:
(j) after the step (i), forming silicide layers over the gate electrode and the epitaxial layer.
3. A method of manufacturing a semiconductor device according to claim 1, further comprising a step of:
(k) between the steps (f) and (h), forming a third impurity region of a second conductivity type being opposite to the first conductivity type in the semiconductor substrate by an ion implantation method.
4. A method of manufacturing a semiconductor device according to claim 3,
wherein the first conductivity type is an n-type, and
wherein the second conductivity type is a p-type.
5. A method of manufacturing a semiconductor device according to claim 1,
wherein the second insulating film includes a silicon oxide film, and
wherein the third insulating film includes a silicon nitride film.
6. A method of manufacturing a semiconductor device according to claim 1,
wherein the second insulating film includes a silicon oxide film, and wherein the fourth insulating film includes a silicon nitride film.

7. A method of manufacturing a semiconductor device according to claim 1,
wherein the first conductivity type is an n-type.

\* \* \* \* \*

UNITED STATES PATENT AND TRADEMARK OFFICE
CERTIFICATE OF CORRECTION

PATENT NO. : 9,978,839 B2  
APPLICATION NO. : 15/628925  
DATED : May 22, 2018  
INVENTOR(S) : Yoshiki Yamamoto et al.

Page 1 of 1

It is certified that error appears in the above-identified patent and that said Letters Patent is hereby corrected as shown below:

On the Title Page

(30) Foreign Application Priority Data should read:

Jan. 23, 2012   (JP) .............. 2012-011213  
Jul. 24, 2012   (JP) .............. 2012-163907

Signed and Sealed this  
Tenth Day of July, 2018

Andrei Iancu  
*Director of the United States Patent and Trademark Office*